United States Patent
Lin et al.

(10) Patent No.: US 10,121,401 B2
(45) Date of Patent: Nov. 6, 2018

(54) SHIFT REGISTER CIRCUIT AND DRIVING METHOD THEREOF

(71) Applicant: AU Optronics Corporation, Hsin-Chu (TW)

(72) Inventors: Jia-Yi Lin, Hsin-Chu (TW); Kuan-Yu Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 227 days.

(21) Appl. No.: 15/374,437

(22) Filed: Dec. 9, 2016

(65) Prior Publication Data
US 2017/0186352 A1    Jun. 29, 2017

(30) Foreign Application Priority Data

Dec. 24, 2015 (TW) .............................. 104143657 A

(51) Int. Cl.
| | |
|---|---|
| *G11C 19/00* | (2006.01) |
| *G09G 3/20* | (2006.01) |
| *G06F 3/041* | (2006.01) |
| *G11C 19/28* | (2006.01) |
| *G09G 3/36* | (2006.01) |

(52) U.S. Cl.
CPC ............ *G09G 3/20* (2013.01); *G06F 3/0412* (2013.01); *G11C 19/28* (2013.01); *G11C 19/287* (2013.01); *G09G 3/3677* (2013.01); *G09G 2300/0408* (2013.01); *G09G 2310/0202* (2013.01); *G09G 2310/0286* (2013.01); *G09G 2310/08* (2013.01); *G09G 2320/0214* (2013.01)

(58) Field of Classification Search
None
See application file for complete search history.

(56) References Cited

U.S. PATENT DOCUMENTS

| | | | | |
|---|---|---|---|---|
| 2016/0266699 | A1* | 9/2016 | Zhao | .................... G09G 3/3677 |
| 2016/0328045 | A1* | 11/2016 | Wang | ..................... G06F 3/016 |
| 2016/0365061 | A1* | 12/2016 | Hong | ..................... G06F 3/041 |

(Continued)

FOREIGN PATENT DOCUMENTS

| | | |
|---|---|---|
| CN | 103474038 A | 12/2013 |
| CN | 105068682 A | 11/2015 |

OTHER PUBLICATIONS

Taiwan Patent Office "Office Action" dated Aug. 23, 2016, Taiwan.

*Primary Examiner* — Tuan T Lam
(74) *Attorney, Agent, or Firm* — WPAT, PC

(57) ABSTRACT

A shift register circuit includes a plurality of shift registers. Each shift register includes a driving module, a voltage pre-storing module, a pulling up module, a pulling down module and a pulling down control module. The voltage pre-storing module includes a reset unit, an electric power storage unit and an output unit. The driving module, the voltage pre-storing module and the reset unit are electrically connected to a first node. One end of the electric power storage unit is electrically connected to the first node, and the another end is configured to receive the touch start signal and the touch end signal. The output unit is electrically connected between the first node and the second node. The pulling up module and the pulling down module are electrically connected to the second node. The pulling down control module is electrically connected to the pulling down module.

20 Claims, 7 Drawing Sheets

(56) References Cited

U.S. PATENT DOCUMENTS

| | | | |
|---|---|---|---|
| 2017/0102801 A1* | 4/2017 | Ko | G06F 3/044 |
| 2017/0123556 A1* | 5/2017 | Lin | G06F 3/0412 |
| 2017/0178584 A1* | 6/2017 | Ma | G09G 3/3677 |
| 2017/0193943 A1* | 7/2017 | Cao | G09G 3/3677 |
| 2017/0269769 A1* | 9/2017 | Hu | G06F 3/0416 |
| 2018/0046308 A1* | 2/2018 | Xiao | G06F 3/0416 |
| 2018/0046311 A1* | 2/2018 | Gu | G06F 3/0416 |

* cited by examiner

SHIFT REGISTER CIRCUIT AND DRIVING METHOD THEREOF

TECHNICAL FIELD

The present disclosure relates to a shift register circuit and a driving method thereof, and in particular, to a shift register circuit applicable to a touch display device and a driving method thereof.

BACKGROUND ART

With the development of science and technology, system integration and manufacturing cost reduction have become the development trend in the electronic industry. In the conventional techniques, a touch system for providing touch sensing for users and a display system for providing image display are substantially two systems that operate independently. However, with the rapid development of smart devices, currently, a touch panel in the touch system has been successfully integrated with a display panel in the display system, such that a user can execute a desired operation directly by touching a display frame.

Currently, the system in which the touch panel and the display panel are integrated is mainly driven in an intermittent manner, i.e., the touch panel and the display panel are driven in separate time intervals, to prevent drive signals for the touch panel and the display panel from interfering with each other. However, the signal originally input to a shift register of the display panel is suspended when the touch panel is driven, so that internal nodes of the shift register are in a floating state, resulting in electric leakage of the internal nodes of the shift register. Further, when driving of the display panel is resumed, the display quality degrades because the drive signal output by the shift register cannot reach a correct voltage level due to the electric leakage of the internal nodes.

SUMMARY OF THE DISCLOSURE

The present disclosure is to provide a shift register circuit and a driving method thereof, to solve the problem that a drive signal output by a shift register cannot reach a correct voltage level when driving of a display panel is resumed.

The shift register circuit disclosed in the present disclosure has a plurality of shift registers. Each shift register has a driving module, a voltage pre-storing module, a pulling up module, a pulling down module, and a pulling down control module. The driving module is electrically connected to a first node, and is configured to provide a control signal to charge the first node. The voltage pre-storing module is electrically connected to the first node, and is configured to output a voltage of the first node to a second node according to a touch start signal and a touch end signal. The voltage pre-storing module has a reset unit, an electric power storage unit, and an output unit. The reset unit is electrically connected to the first node, and is configured to reset the voltage of the first node according to a reset signal. One end of the electric power storage unit is electrically connected to the first node, and the other end is configured to receive the touch start signal and the touch end signal. The output unit is electrically connected between the first node and the second node, for outputting the voltage of the first node to the second node according to the touch start signal and the touch end signal. The pulling up module is electrically connected to the second node, and is configured to output a drive signal according to a voltage of the second node. The pulling down module is electrically connected to the second node, and is configured to adjust a voltage level of the drive signal and a voltage level of the second node according to a pulling down signal. The pulling down control module is electrically connected to the pulling down module, and is configured to generate the pulling down signal according to a first clock signal.

The driving method of a shift register circuit disclosed in the present disclosure is applicable to a plurality of shift registers in a shift register circuit, where each shift register has a driving module, a voltage pre-storing module, a pulling up module, a pulling down module, and a pulling down control module. The driving module is electrically connected to a first node, the voltage pre-storing module is electrically connected between the first node and a second node, the pulling up module and the pulling down module are electrically connected to the second node, and the pulling down control module is electrically connected to the pulling down module. In the driving method of a shift register circuit, a control signal is provided to charge the first node at the beginning of a touch enable interval. A touch end signal is coupled to the first node at the end of the touch enable interval. In a display enable interval, a voltage of the first node is output to the second node according to the touch end signal, and the shift register circuit alternately executes the touch enable interval and the display enable interval.

According to the shift register circuit and the driving method thereof disclosed in the present disclosure, the voltage pre-storing module is used to store the control signal in the first node in the touch enable interval, and when the display enable interval is resumed, the voltage pre-stored in the first node is output to the second node, thereby solving the problem that the drive signal output by the shift register cannot reach the correct voltage level.

The above description of the content of the present disclosure and the following illustration of the embodiments are intended to demonstrate and explain the spirit and principle of the present disclosure and to provide further explanations of the claims of the present disclosure.

BRIEF DESCRIPTIONS OF THE DRAWINGS

DETAILED DESCRIPTIONS OF THE INVENTION

The following detailed description describes in detail the characteristics and advantages of the instant disclosure, the content of which is sufficient to enable any person skilled in the relevant art to understand the technical content of the instant disclosure and implement accordingly, and according to the content, the claims and figures disclosed by the present specification, any person skilled in the relevant art can easily understand the purpose and advantages of the instant disclosure. The following embodiments further illustrate the aspects of the present disclosure, but they do not limit the scope of the present disclosure.

Figure 1:
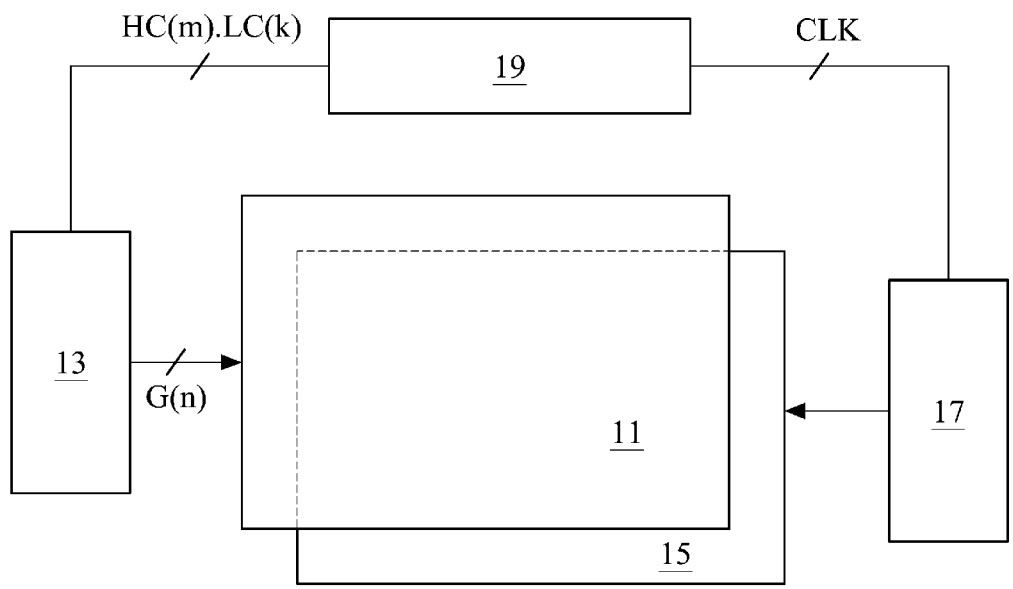
FIG. 1 is a schematic diagram of a touch display device illustrated according to an embodiment of the present disclosure.

Referring to FIG. 1, FIG. 1 is a schematic diagram of a touch display device illustrated according to an embodiment of the present disclosure. As shown in FIG. 1, a touch display device 10 has a display panel 11, a display control circuit 13, a touch panel 15, a touch control circuit 17, and a timing control circuit 19. The display panel 11 has a plurality of display scan lines and a plurality of data lines, and when the display panel 11 is driven, each display scan line receives one drive signal, so as to drive a pixel unit coupled to the data line to receive a data signal. The touch panel 15 has a plurality of touch scan lines and a sensing line, and when the touch panel 15 is driven, each touch scan line receives one touch drive signal, so as to drive touch units coupled to the sensing line to sequentially generate, in a touch enable interval, sensing signals for touch sensing. The drive signal of the display panel 11 is generated by a shift register circuit in the display control circuit 13, and the touch drive signal of the touch panel 15 is generated by the touch control circuit 17. The timing control circuit 19 is configured to provide a timing signal required for the operation of the display control circuit 13 and the touch control circuit 17.

In one embodiment, the shift register circuit has multiple stages of shift registers, and each stage of shift register is configured to output one drive signal. Taking an $n^{th}$-stage shift register as an example, the $n^{th}$-stage shift register receives a clock signal provided by the timing control circuit 19, such as a low-frequency signal LC(k) and a high-frequency signal HC(m) as well as a touch start signal TP_start and a touch end signal TP_end, to perform operations. The touch start signal TP_start and the touch end signal TP_end may be signals output by the same signal output line, and an output high voltage level is alternately defined as the touch start signal TP_start or the touch end signal TP_end, i.e., the first output high voltage level is the touch start signal TP_start, the second output high voltage level is the touch end signal TP_end, and so on. In other embodiments, the touch start signal TP_start and the touch end signal TP_end may also be signals output by two different signal output lines, which is not limited in the present embodiment.

The touch start signal TP_start and the touch end signal TP_end are, for example, signals provided by the timing control circuit 19 to the touch control circuit 17 such that the touch control circuit 17 performs touch sensing in the touch enable interval. The touch start signal TP_start and the touch end signal TP_end may also be, for example, signals enabled through a touch of a user, signals directly provided by the touch control circuit 17 to the display control circuit 13, or other suitable signals, which is not limited in the present embodiment. To facilitate the description of the shift register circuit, in the following embodiments, the touch start signal TP_start and the touch end signal TP_end received by the shift register circuit are signals output by the same signal output line, which, however, is not intended to limit other feasible implementations of the present disclosure.

Figure 2:
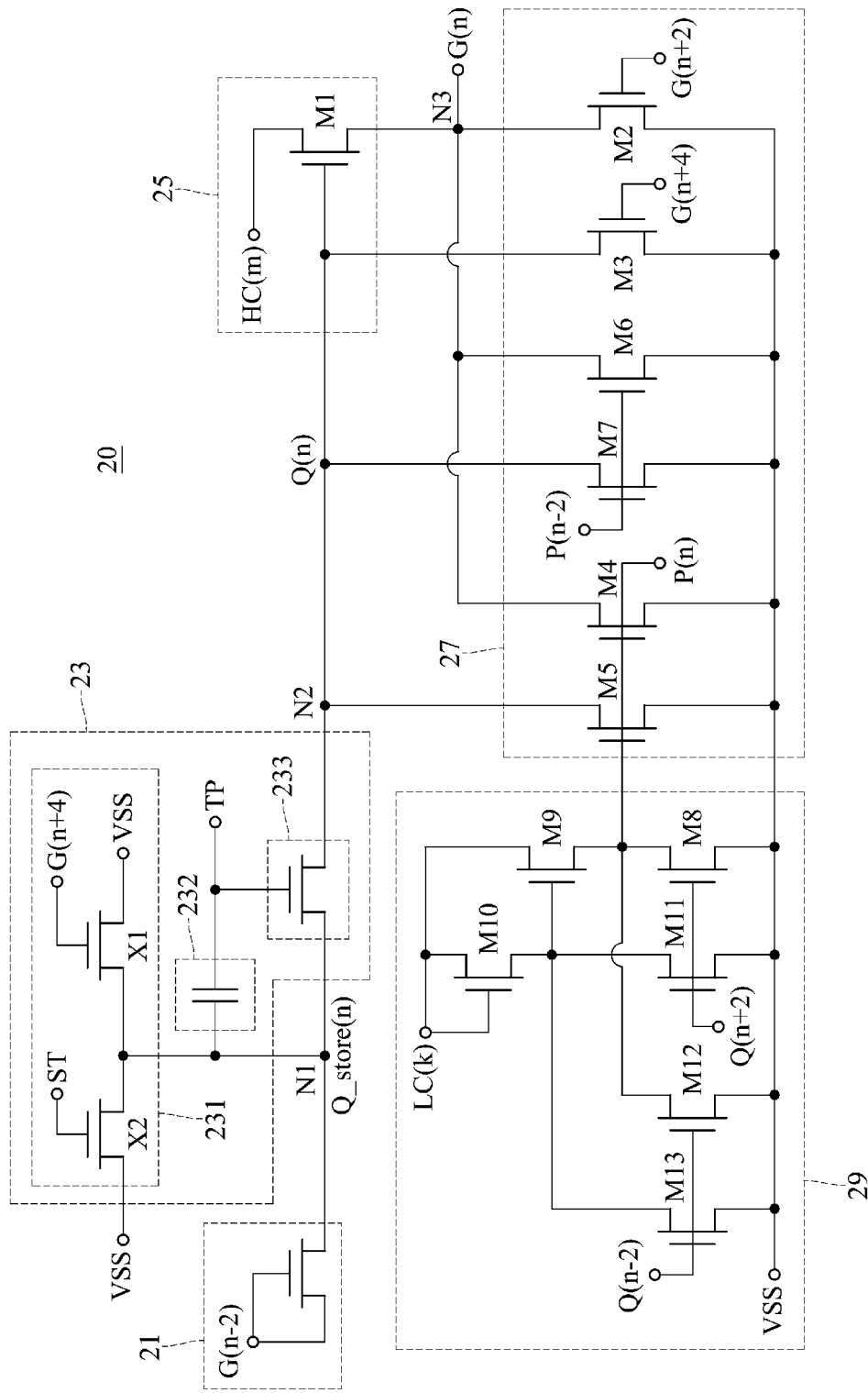
FIG. 2 is a schematic circuit diagram of a shift register illustrated according to an embodiment of the present disclosure.

Referring to FIG. 2, FIG. 2 is a schematic circuit diagram of a shift register illustrated according to an embodiment of the present disclosure. A shift register circuit has a plurality of shift registers 20. For the convenience of illustration, FIG. 2 merely shows a schematic circuit diagram of an $n^{th}$-stage shift register 20 in the shift register circuit. Persons of ordinary skill in the art can understand the architecture of the shift register circuit according to the shift register 20 shown in FIG. 2, and therefore, details are not repeatedly described herein.

As shown in FIG. 2, the $n^{th}$-stage shift register 20 has a driving module 21, a voltage pre-storing module 23, a pulling up module 25, a pulling down module 27, and a pulling down control module 29. The driving module 21 is electrically connected to a first node N1, and is configured to provide a control signal to charge the first node N1. The voltage pre-storing module 23 is electrically connected to the first node N1, and is configured to output a voltage of the first node N1 to a second node N2 according to a touch start signal TP_start and a touch end signal TP_end. The voltage pre-storing module 23 has a reset unit 231, an electric power storage unit 232, and an output unit 233, and the details thereof are illustrated below. The pulling up module 25 is electrically connected to the second node N2, and is configured to output a drive signal G(n) according to a voltage of the second node N2. The pulling down module 27 is electrically connected to the second node N2, and is configured to adjust a voltage level of the drive signal G(n) and a voltage level of the second node N2 according to a pulling down signal P(n). The pulling down control module 29 is electrically connected to the pulling down module 27, and is configured to generate the pulling down signal P(n) according to a low-frequency signal LC(k).

In the present embodiment, the control signal of the driving module 21 is output according to a drive signal G(n−2) output by an (n−2)$^{th}$-stage shift register. In addition to the pulling down signal P(n) generated according to the low-frequency signal LC(k), the pulling down module 27 further includes, but is not limited to, a pulling down signal P(n−2) generated by a pulling down module of the (n−2)$^{th}$-stage shift register, a drive signal G(n+2) generated by an (n+2)$^{th}$-stage shift register, and a drive signal G(n+4) generated by an (n+4)$^{th}$-stage shift register. Persons of ordinary skill in the art can replace the control signal of the driving module 21 and the pulling down signal of the pulling down module 27 according to the designs.

The reset unit 231 of the voltage pre-storing module 23 is electrically connected to the first node N1, and is configured to reset the voltage of the first node N1 according to a reset signal. One end of the electric power storage unit 232 is electrically connected to the first node N1, and the other end is configured to receive the touch start signal TP_start and the touch end signal TP_end. The output unit 233 is electrically connected between the first node N1 and the second node N2, and is configured to output the voltage of the first node N1 to the second node N2 according to the touch start signal TP_start and the touch end signal TP_end.

More specifically, the reset unit 231 has a first reset switch X1 and a second reset switch X2. A first end of the first reset switch X1 is electrically connected to the first node N1, a second end of the first reset switch X1 is electrically connected to a reference voltage end VSS, and a control end of the first reset switch X1 receives a drive signal of a shift register of another stage, for example, the drive signal G(n+4) of the (n+4)$^{th}$-stage shift register. A first end of the second reset switch X2 is electrically connected to the first node N1, a second end of the second reset switch is electrically connected to the reference voltage end VSS, and a control end of the second reset switch receives a start signal ST.

The electric power storage unit 232 is, for example, a capacitor, and the output unit 233 is, for example, a transistor switch. A first end of the output unit 233 is electrically connected to the first node N1, a second end of the output unit 233 is electrically connected to the second node N2, and a control end of the output unit 233 is configured to receive the touch start signal TP_start and the touch end signal TP_end.

In the embodiment shown in FIG. 2, the driving module 21 is, for example, a transistor switch. A first end of the driving module 21 is electrically connected to the first node N1, a second end and a control end of the driving module 21 are configured to receive a drive signal of a shift register of another stage, for example, the drive signal G(n−2) of the $(n-2)^{th}$-stage shift register. The pulling up module 25 has a first switch M1, a first end of the first switch M1 is configured to receive a high-frequency signal HC(m), a second end of the first switch M1 is electrically connected to an output node N3, and a control end of the first switch M1 is electrically connected to the second node N2.

The pulling down module 27 has a second switch M2, a third switch M3, a fourth switch M4, a fifth switch M5, a sixth switch M6, and a seventh switch M7. A first end of the second switch M2 is electrically connected to the output node N3, a second end of the second switch is electrically connected to the reference voltage end VSS, a control end of the second switch M2 is configured to receive a drive signal of a shift register of another stage, for example, the drive signal G(n+2) of the $(n+2)^{th}$-stage shift register. A first end of the third switch M3 is electrically connected to the second node N2, a second end of the third switch M3 is electrically connected to the reference voltage end VSS, and a control end of the third switch is configured to receive a drive signal of a shift register of the another stage, for example, the drive signal G(n+4) of the $(n+4)^{th}$-stage shift register.

A first end of the fourth switch M4 is electrically connected to the output node N3, a second end of the fourth switch M4 is electrically connected to the reference voltage end VSS, and a control end of the fourth switch M4 is electrically connected to the pulling down control module 29. A first end of the fifth switch M5 is electrically connected to the second node N2, a second end of the fifth switch M5 is electrically connected to the reference voltage end VSS, and a control end of the fifth switch M5 is electrically connected to the pulling down control module 29. A first end of the sixth switch M6 is electrically connected to the output node N3, a second end of the sixth switch M6 is electrically connected to the reference voltage end VSS, and a control end of the sixth switch M6 is electrically connected to a pulling down control module of a shift register of another stage, for example, a pulling down control module of the $(n-2)^{th}$-stage shift register. A first end of the seventh switch M7 is electrically connected to the second node N2, a second end of the seventh switch M7 is electrically connected to the reference voltage end VSS, and a control end of the seventh switch M7 is electrically connected to a pulling down control module of a shift register of another stage, for example, the pulling down control module of the $(n-2)^{th}$-stage shift register.

The pulling down control module 29 has an eighth switch M8, a ninth switch M9, a first pulling down control switch M10, a second pulling down control switch M11, a third pulling down control switch M12, and a fourth pulling down control switch M13. A first end of the eighth switch M8 is electrically connected to the control end of the fifth switch M5, a second end of the eighth switch M8 is electrically connected to the reference voltage end VSS, and a control end of the eighth switch M8 is electrically connected to a second node of a shift register of another stage, for example, a second node of the $(n+2)^{th}$-stage shift register. A first end of the ninth switch M9 is configured to receive a low-frequency signal LC(k), a second end of the ninth switch M9 is electrically connected to the control end of the fifth switch M5, and a control end of the ninth switch selectively receives the low-frequency signal LC(k) or a reference voltage of the reference voltage end VSS. A first end and a control end of the first pulling down control switch M10 are configured to receive the low-frequency signal LC(k), and a second end of the first pulling down control switch M10 is electrically connected to the control end of the ninth switch M9. A first end of the second pulling down control switch M11 is electrically connected to the control end of the ninth switch M9, a second end of the second pulling down control switch M11 is electrically connected to the reference voltage end VSS, and a control end of the second pulling down control switch M11 is electrically connected to the second node of a shift register of another stage, for example, the second node of the $(n+2)^{th}$-stage shift register. A first end of the third pulling down control switch M12 is electrically connected to the second end of the ninth switch M9, a second end of the third pulling down control switch M12 is electrically connected to the reference voltage end VSS, and a control end of the third pulling down control switch M12 is electrically connected to a second node of a shift register of another stage, for example, a second node of the $(n-2)^{th}$-stage shift register.

A first end of the fourth pulling down control switch M13 is electrically connected to the control end of the ninth switch M9, a second end of the fourth pulling down control switch M13 is electrically connected to the reference voltage end VSS, and a control end of the fourth pulling down control switch M13 is electrically connected to a second node of a shift register of another stage, for example, a second node of the $(n-2)^{th}$-stage shift register.

Figure 3:
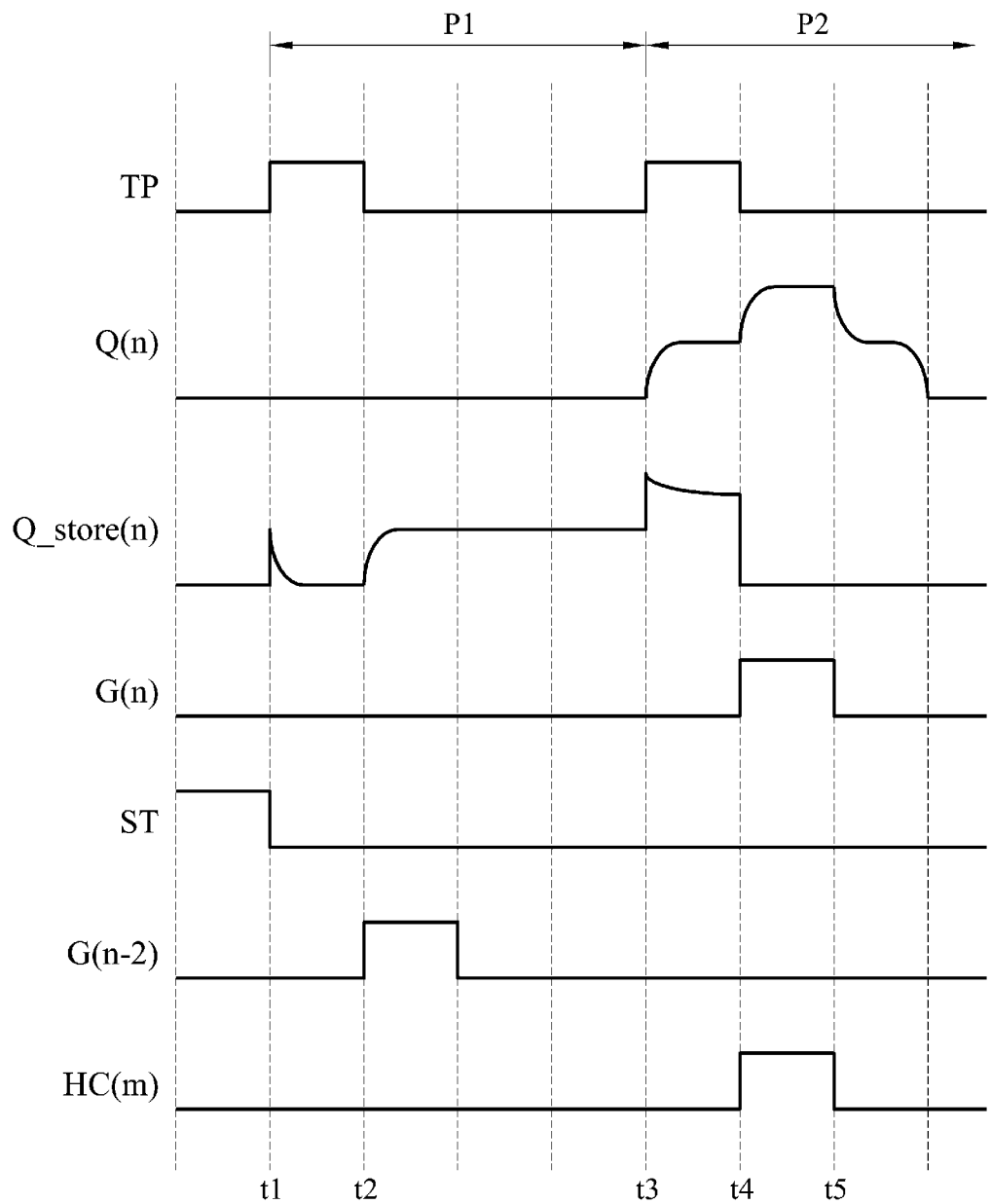
FIG. 3 is a timing diagram of a shift register illustrated according to an embodiment of the present disclosure.

In the present embodiment, the reference voltage end VSS is at, for example, a low voltage level of a gate drive voltage; the voltage level of the first node N1 is at, for example, a voltage level of a pre-storing signal Q_store(n); the voltage level of the second node N2 is at, for example, a voltage level of a control signal Q(n); the output node N3 is at, for example, a voltage level of the drive signal G(n) or a gate drive signal, i.e., a drive signal provided to a display scan line. In order to illustrate the operation of the shift register more clearly, referring to FIG. 2 and FIG. 3 together. FIG. 3 is a timing diagram of a shift register circuit illustrated according to an embodiment of the present disclosure. As shown in the figures, in the present embodiment, the touch start signal TP_start and the touch end signal TP_end are, for example, touch signals TP output by the same touch signal line, the first rising signal of the touch signal TP defines the touch start signal TP_start, and the second rising signal of the touch signal TP defines the touch end signal TP_end. A time interval between a falling edge of the touch start signal TP_start and a rising edge of the touch end signal TP_end is defined as a touch enable interval P1. A time interval between the rising edge of the touch end signal TP_end and a rising edge of a next touch start signal TP_start is defined as a display enable interval P2. The touch enable interval P1 is a time interval in which the touch scan line of the touch panel is driven by a touch drive signal, to drive touch units to sequentially generate sensing signals. The display enable interval P2 is a time interval in which the shift register 20 generates drive signals to drive pixel units to receive data signals.

At the beginning of the touch enable interval P1, the driving module 21 provides a control signal G(n−2) to charge the first node N1. At the end of the touch enable interval P1, the voltage pre-storing module 23 couples the touch end signal TP_end to the first node N1. In the display enable interval P2, the voltage pre-storing module 23 outputs the voltage of the first node N1 to the second node N2 according to the touch end signal TP_end. In the present embodiment, the shift register 20 alternately executes the touch enable interval P1 and the display enable interval P2.

More specifically, before a first time point t1 of the touch enable interval P1, a control end of the second reset switch X2 of the reset unit 231 receives a start signal ST, such that the second reset switch X2 is turned on to reset the voltage level of the first node N1 to a reference voltage. In one embodiment, the start signal ST is a start reset signal for the whole touch display device, and when the touch display device is started, the voltage level of each node is reset. In other embodiments, the start signal ST is a reset signal ahead of the drive signal output by the first-stage shift register.

At the first time point t1, the voltage level of the touch signal TP rises, the touch enable interval P1 begins, and the voltage level of the touch signal TP is coupled by the electric power storage unit 232 to the first node N1, such that the voltage level of the first node N1 rises quickly. When the output unit 233 is turned on, the voltage level of the first node N1 is pulled down to the voltage level of the control signal Q(n). At the second time point t2, the voltage level of the touch signal TP falls, and the drive signal G(n−2) of the (n−2)$^{th}$-stage shift register rises, such that the driving module 21 is turned on, to provide the drive signal G(n−2) to charge the first node N1, and thus the electric power storage unit 232 stores electric power.

At a third time point t3, the voltage level of the touch signal TP rises for the second time, and the touch enable interval P1 comes to an end, and is switched to the display enable interval P2. At this time, the touch signal TP and the electric power stored in the electric power storage unit 232 are coupled to the voltage level of the first node N1, to increase the voltage level of the first node N1. Moreover, the output unit 233 is turned on, to output the voltage level of the first node N1 to the second node N2, and the voltage level of the control signal Q(n) of the second node N2 rises. At a fourth time point t4, the voltage level of the touch signal TP falls, and the electric power storage unit 232 discharges, such that the voltage level of the first node N1 falls. At this time, the voltage level of the high-frequency signal HC(m) rises, a rising module 25 is turned on after receiving the control signal Q(n) at a high voltage level, and provides the high-frequency signal HC(m) to charge the output node N3, such that the drive signal G(n) of the output node N3 rises to the voltage level of the high-frequency signal HC(m). At a fifth time point t5, the rising module 25 is turned on, the voltage level of the high-frequency signal HC(m) falls, and the drive signal G(n) of the output node N3 is pulled down to the voltage level of the high-frequency signal HC(m).

In the embodiment shown in FIG. 2, when the drive signal G(n+4) of the (n+4)$^{th}$-stage shift register rises, the third switch M3 is turned on, and the voltage level of the second node is pulled down to the reference voltage. When the drive signal G(n+4) of the (n+4)$^{th}$-stage shift register rises, the first reset switch X1 is turned on, and the voltage level of the first node N1 is reset to the voltage level of the reference voltage end VSS. At this time, similarly, the third switch M3 is turned on, to pull down the voltage level of the second node to the reference voltage. In addition, when the voltage level of the low-frequency signal LC(k) rises, the ninth switch M9 and the first pulling down control switch M10 are turned on, to output the pulling down signal P(n), such that the fourth switch M4 and the fifth switch M5 are turned on, also pulling down the voltage level of the second node to the reference voltage.

Figure 4:
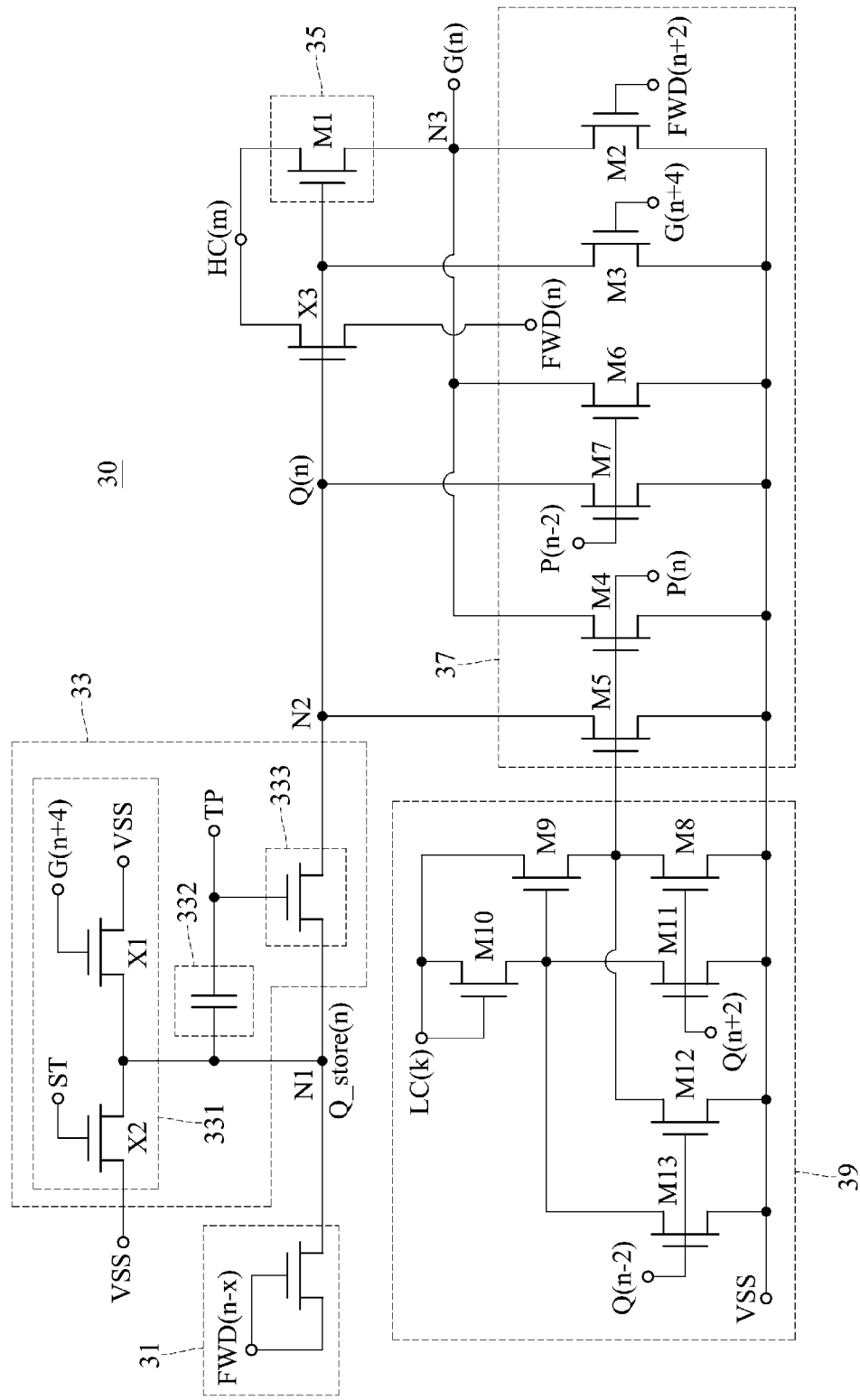
FIG. 4 is a schematic circuit diagram of a shift register illustrated according to another embodiment of the present disclosure.

Referring to FIG. 4, FIG. 4 is a schematic circuit diagram of a shift register illustrated according to another embodiment of the present disclosure. As shown in FIG. 4, a driving module 31, a voltage pre-storing module 33, a pulling up module 35, a pulling down module 37, and a pulling down control module 39 are generally the same as those in the previous embodiment. The difference from the previous embodiment is that, the shift register 30 further has an independent forwarding switch X3. A first end of the independent forwarding switch X3 is configured to receive a high-frequency signal HC(m), a control end of the independent forwarding switch X3 is electrically connected to a second node N2, a second end of the independent forwarding switch X3 is configured to output a forwarding signal FWD(n) according to a voltage level of the second node N2, such that the forwarding signal FWD(n) serves as a control signal of a driving module of a shift register of another stage.

In other words, in the embodiment shown in FIG. 4, the control signal of the driving module 31 is output according to a forwarding signal FWD (n−x) output by an independent forwarding switch X3 of an (n−x)$^{th}$-stage shift register. In addition, a second switch M2 in the pulling down module 37 is also controlled by a forwarding signal FWD (n+2) output by an independent forwarding switch X3 of an (n+2)$^{th}$-stage shift register. The timing of the embodiment shown in FIG. 4 is generally the same as the timing of the embodiment shown in FIG. 2, which can be understood by persons of ordinary skill in the art on the basis of the aforementioned disclosure, and therefore is not repeated in detail. In the embodiment shown in FIG. 4, whether the independent forwarding switch X3 is disposed or not depends on the control signal that the driving module 31 uses as a basis; that is to say, when the driving module 31 sets the control signal served as a basis to be a forwarding signal FWD(n−x), an independent forwarding switch X3 will be disposed in the shift register to generate the forwarding signal.

Figure 5:
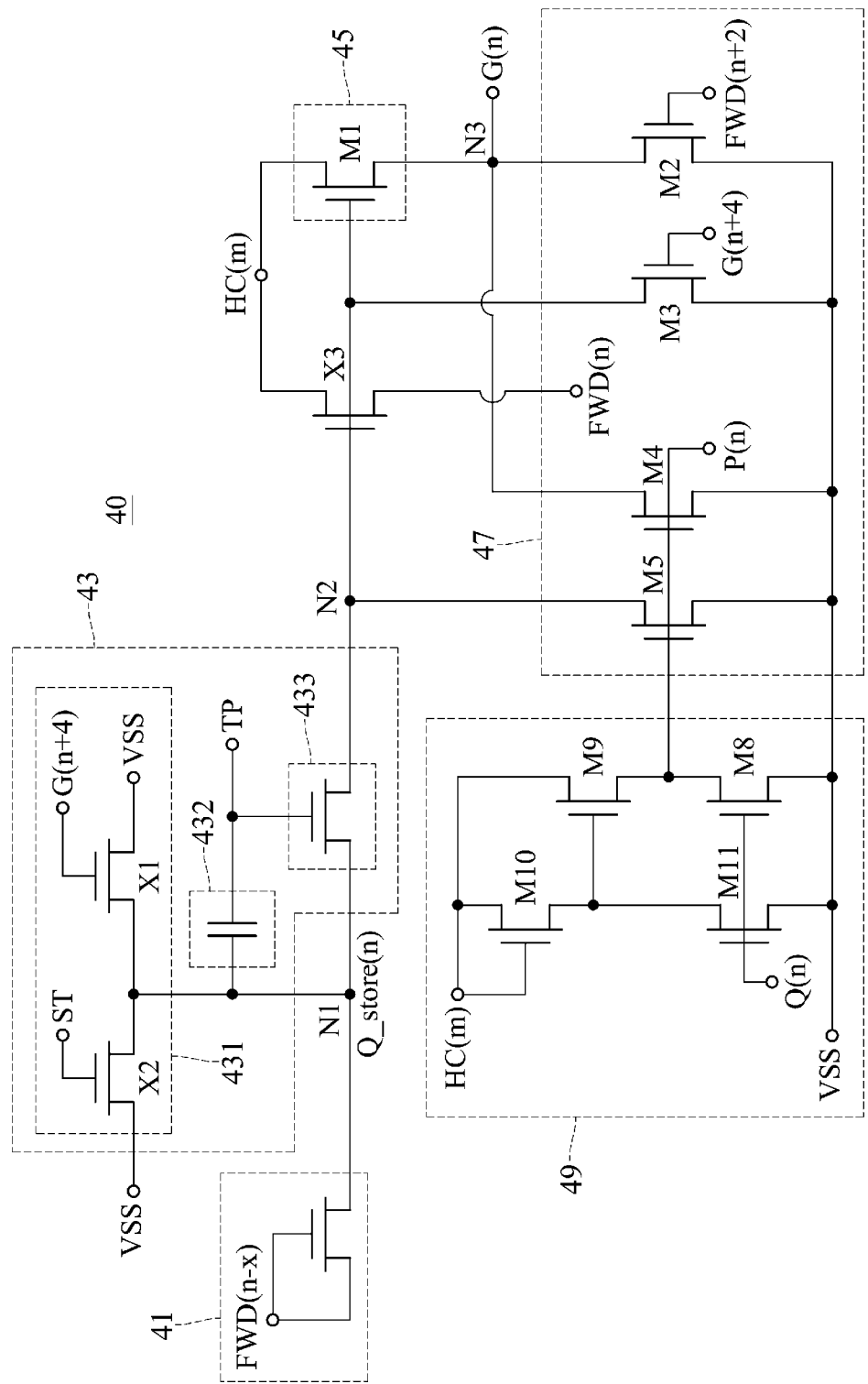
FIG. 5 is a schematic circuit diagram of a shift register illustrated according to still another embodiment of the present disclosure.

Furthermore, referring to FIG. 5, FIG. 5 is a schematic circuit diagram of a shift register illustrated according to still another embodiment of the present disclosure. As shown in FIG. 5, a driving module 41, a voltage pre-storing module 43, a pulling up module 45, and an independent forwarding switch X3 are generally the same as those in the embodiment shown in FIG. 4. The difference from the previous embodiment is that, the sixth switch M6 and the seventh switch M7 are omitted from a pulling down module 47 of a shift register 40. The third pulling down control switch M12 and the fourth pulling down control switch M13 are also omitted from a pulling down control module 49 of the shift register 40. In addition, a first end and a control end of a first pulling down control switch N410 in the pulling down control module 49 are configured to receive a high-frequency signal HC(m), and a control end of the fourth pulling down switch M11 and a control end of an eighth switch M8 are configured to receive a voltage level of a second node N2, for example, a control signal Q(n).

Likewise, the timing of the embodiment shown in FIG. 5 is generally the same as the timing of the embodiment shown in FIG. 2, which can be understood by persons of ordinary skill in the art on the basis of the aforementioned disclosure, and therefore is not repeated in detail.

Figure 6:
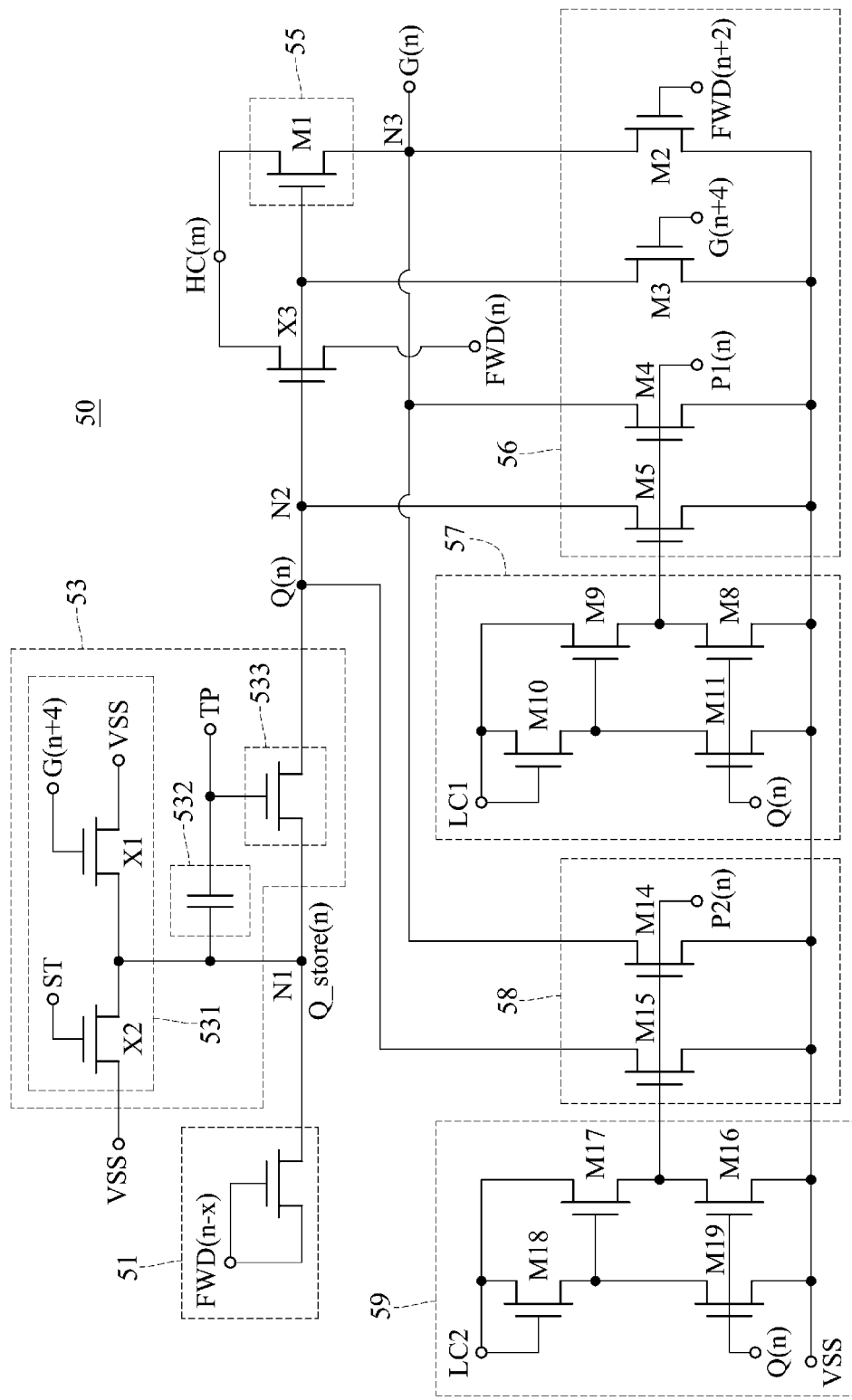
FIG. 6 is a schematic circuit diagram of a shift register illustrated according to the another embodiment of the present disclosure.

In the another embodiment, referring to FIG. 6, FIG. 6 is a schematic circuit diagram of a shift register illustrated according to the another embodiment of the present disclosure. As shown in FIG. 6, a driving module 51, a voltage pre-storing module 53, a pulling up module 55, and an independent forwarding switch X3 are generally the same as those in the embodiment shown in FIG. 5. The difference from the previous embodiment is that, the shift register 50 has a first pulling down module 56, a first pulling down control module 57, a second pulling down module 58, and a second pulling down control module 59.

The first pulling down module 56 is generally the same as the pulling down module 37 shown in FIG. 4, the first pulling down control module 57 is generally the same as the pulling down control module 39 shown in FIG. 4, and the difference is that a first end and a control end of a first pulling down control switch M10 in the pulling down control module 57 are configured to receive a first low-frequency signal LC1. The second pulling down module 58 has a pulling down switch M14 and a pulling down switch N415. A first end of the pulling down switch M14 is electrically connected to the output node N3, a second end of the pulling down switch M14 is electrically connected to a reference voltage end VSS, and a control end of the pulling down switch M14 is electrically connected to the second pulling down control module 59. A first end of the pulling down switch M15 is electrically connected to a second node N2, a second end of the pulling down switch M15 is electrically connected to the reference voltage end VSS, and a control end of the pulling down switch M15 is electrically connected to the second pulling down control module 59.

The second pulling down control module 59 has pulling down control switches M16, M17, M18, and M19. A first end of the pulling down control switch M16 is electrically connected to the control end of the pulling down switch M15, a second end of the pulling down control switch M16 is electrically connected to the reference voltage end VSS, and a control end of the pulling down control switch M16 receives a voltage level of the second node N2. A first end and a control end of the pulling down control switch M18 are configured to receive a second low-frequency signal LC2, and a second end of the pulling down control switch M18 is electrically connected to a control end of the pulling down control switch M17. A first end of the pulling down control switch M17 is configured to receive the second low-frequency signal LC2, and a second end of the pulling down control switch M17 is electrically connected to the control end of the pulling down switch M15. A first end of the pulling down control switch M19 is electrically connected to the second end of the pulling down control switch M18, a second end of the pulling down control switch M19 is electrically connected to the reference voltage end VSS, and a control end of the pulling down control switch M19 receives the voltage level of the second node N2.

In the embodiment shown in FIG. 6, the first low-frequency signal LC1 received by the first pulling down control switch M10 and the second low-frequency signal LC2 received by the pulling down control switch M18 are reverse signals. In addition, the timing of the embodiment shown in FIG. 6 is generally the same as the timing of the embodiment shown in FIG. 2, which can be understood by persons of ordinary skill in the art on the basis of the aforementioned disclosure, and therefore is not repeated in detail.

Figure 7:
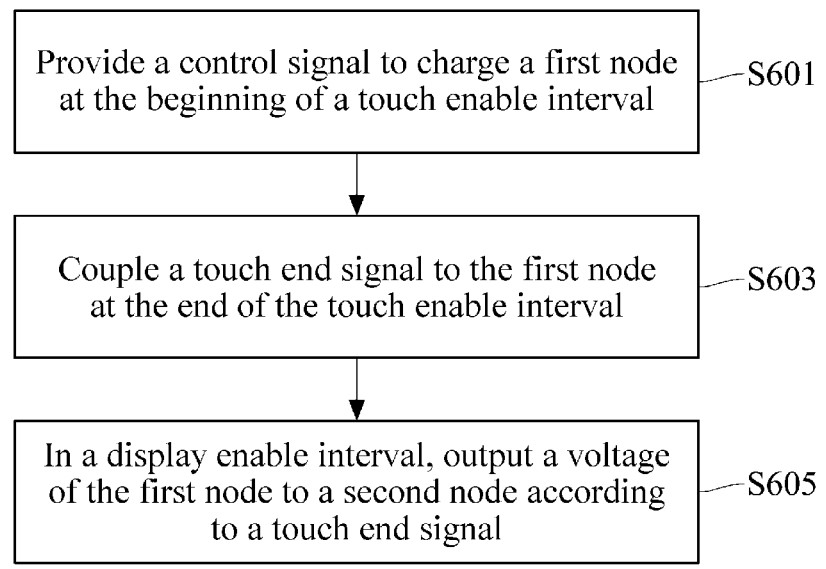
FIG. 7 is a flow chart of steps of a driving method of a shift register illustrated according to an embodiment of the present disclosure.

Next, in order to explain a driving method of a shift register circuit, referring to FIG. 2 and FIG. 7 together. FIG. 7 is a flow chart of steps of a driving method of a shift register circuit illustrated according to an embodiment of the present disclosure. As shown in the figures, in Step S601, the driving module 21 provides a control signal G(n−2) to charge the first node N1 at the beginning of a touch enable interval P1. In Step S603, the voltage pre-storing module 23 couples a touch end signal TP_end to the first node N1 at the end of the touch enable interval P1. In Step S605, the voltage pre-storing module 23 outputs a voltage of the first node N1 to the second node N2 according to the touch end signal TP_end at the beginning of a display enable interval P2. The driving method of a shift register circuit described in the present disclosure has practically been disclosed in the embodiments described above, and therefore is not repeated in the present embodiment.

To sum up, according to the shift register circuit and the driving method thereof provided in the embodiments of the present disclosure, a control signal is first stored in a first node of a voltage pre-storing module in a touch enable interval, and when a display enable interval is resumed, the voltage pre-stored in the first node is output to a second node, thereby solving the problem that a drive signal output by a shift register cannot reach a correct voltage level. In addition, in the embodiments, by means of coupling performed by an energy storage unit in the voltage pre-storing module, when the display enable interval is resumed, voltages of the first node and the second node can be increased to a higher voltage level, such that a voltage level of an output node can also be increased to an ordinary voltage level more quickly, thereby enhancing the display quality.

While the present disclosure has been disclosed with the above embodiments, these embodiments are not intended to limit the present disclosure. All alterations and modifications fall within the protection scope of the disclosure, without departing from the essences and scope of the disclosure. Regarding the scope of patent protection defined by the present disclosure, please refer to the appended claims.

What is claimed is:
1. A shift register circuit, comprising a plurality of shift registers, each of the shift registers comprising:
  a driving module, electrically connected to a first node, providing a control signal to charge the first node;
  a voltage pre-storing module, electrically connected to the first node, and configured to output a voltage of the first node to a second node according to a touch start signal and a touch end signal, the voltage pre-storing module comprising:
  a reset unit, electrically connected to the first node, and configured to reset the voltage of the first node according to a reset signal;
  an electric power storage unit, with one end electrically connected to the first node, and another end receiving the touch start signal and the touch end signal; and
  an output unit, electrically connected between the first node and the second node, for outputting the voltage of the first node to the second node according to the touch start signal and the touch end signal;
  a pulling up module, electrically connected to the second node, outputting a drive signal according to a voltage of the second node;
  a pulling down module, electrically connected to the second node, adjusting a voltage level of the drive signal and a voltage level of the second node according to a pulling down signal; and a pulling down control module, electrically connected to the pulling down module, generating the pulling down signal according to a first clock signal.

2. The shift register circuit of claim 1, wherein the reset signal comprises a drive signal of an adjacent shift register, the reset unit comprises a first reset switch, the first reset switch has a first end, a second end, and a control end, the first end of the first reset switch is electrically connected to the first node, the second end of the first reset switch is electrically connected to a reference voltage end, and the control end of the first reset switch receives the drive signal of the adjacent shift register, wherein the first reset switch resets the first node's voltage to the reference voltage end's voltage level according to the drive signal of the adjacent shift register.

3. The shift register circuit of claim 2, wherein the reset signal further comprises a start signal, the start signal being ahead of a drive signal output by a first-stage shift register, the reset unit further comprises a second reset switch, the second reset switch has a first end, a second end, and a control end, the first end of the second reset switch is electrically connected to the first node, the second end of the second reset switch is electrically connected to the reference voltage end, and the control end of the second reset switch receives the start signal, wherein the second reset switch resets the voltage of the first node to the voltage level of the reference voltage end according to the start signal.

4. The shift register circuit of claim 1, wherein the output unit has a first end, a second end, and a control end, the first end of the output unit is electrically connected to the first node, the second end of the output unit is electrically connected to the second node, and the control end of the output unit receives the touch start signal and the touch end signal.

5. The shift register circuit of claim 1, wherein the electric power storage unit adjusts the first node's voltage level according to the touch end signal.

6. The shift register circuit of claim 1, wherein the pulling up module comprises:
a first switch, having a first end, a second end, and a control end, wherein the first end of the first switch receives a second clock signal, the second end of the first switch is electrically connected to an output node for outputting the drive signal, and the control end of the first switch is electrically connected to the second node.

7. The shift register circuit of claim 6, wherein the pulling down module comprises:
a second switch, having a first end, a second end, and a control end, wherein the first end of the second switch is electrically connected to the output node, the second end of the second switch is electrically connected to a reference voltage end, and the control end of the second switch receives a drive signal of an adjacent shift register; and
a third switch, having a first end, a second end, and a control end, wherein the first end of the third switch is electrically connected to the second node, the second end of the third switch is electrically connected to the reference voltage end, and the control end of the third switch is configured to receive the drive signal of the adjacent shift register.

8. The shift register circuit of claim 7, wherein the pulling down module further comprises:
a fourth switch, having a first end, a second end, and a control end, wherein the first end of the fourth switch is electrically connected to the output node, the second end of the fourth switch is electrically connected to the reference voltage end, and the control end of the fourth switch is electrically connected to the pulling down control module; and
a fifth switch, having a first end, a second end, and a control end, wherein the first end of the fifth switch is electrically connected to the second node, the second end of the fifth switch is electrically connected to the reference voltage end, and the control end of the fifth switch is electrically connected to the pulling down control module.

9. The shift register circuit of claim 8, wherein the pulling down module further comprises:
a sixth switch, having a first end, a second end, and a control end, wherein the first end of the sixth switch is electrically connected to the output node, the second end of the sixth switch is electrically connected to the reference voltage end, and the control end of the sixth switch is electrically connected to a pulling down control module of the adjacent shift register; and
a seventh switch, having a first end, a second end, and a control end, wherein the first end of the seventh switch is electrically connected to the second node, the second end of the seventh switch is electrically connected to the reference voltage end, and the control end of the seventh switch is electrically connected to the pulling down control module of the adjacent shift register.

10. The shift register circuit of claim 8, wherein the pulling down control module comprises:
an eighth switch, having a first end, a second end, and a control end, wherein the first end of the eighth switch is electrically connected to the control end of the fifth switch, the second end of the eighth switch is electrically connected to the reference voltage end, and the control end of the eighth switch is electrically connected to a second node of the adjacent shift register; and
a ninth switch, having a first end, a second end, and a control end, wherein the first end of the ninth switch receives a third clock signal, the second end of the ninth switch is electrically connected to the control end of the fifth switch, and the control end of the ninth switch selectively receives the third clock signal or a reference voltage of the reference voltage end.

11. The shift register circuit of claim 10, wherein the pulling down control module comprises:
a first pulling down control switch, having a first end, a second end, and a control end, wherein the first end and the control end of the first pulling down control switch receive the third clock signal, and the second end of the first pulling down control switch is electrically connected to the control end of the ninth switch; and
a second pulling down control switch, having a first end, a second end, and a control end, wherein the first end of the second pulling down control switch is electrically connected to the control end of the ninth switch, the second end of the second pulling down control switch is electrically connected to the reference voltage end, and the control end of the second pulling down control switch is electrically connected to the second node of the adjacent shift register.

12. A driving method of a shift register circuit, applicable to a plurality of shift registers in a shift register circuit, each of the shift registers having a driving module, a voltage pre-storing module, a pulling up module, a pulling down module, and a pulling down control module with the driving module being electrically connected to a first node, the voltage pre-storing module being electrically connected between the first node and a second node, the pulling up module and the pulling down module being electrically connected to the second node, and the pulling down control module being electrically connected to the pulling down module, the driving method of the shift register circuit comprising:

provide a control signal to charge the first node at a beginning of a touch enable interval;

coupling a touch end signal to the first node at the end of the touch enable interval; and in a display enable interval, outputting a voltage of the first node to the second node according to the touch end signal, wherein the shift register circuit alternately executes the touch enable interval and the display enable interval.

13. The driving method of claim 12, wherein the touch enable interval is between a falling edge of a touch start signal and a rising edge of the touch end signal.

14. The driving method of claim 13, wherein at a rising edge of the touch start signal, the touch start signal is coupled to the first node to increase a voltage level of the first node.

15. The driving method of claim 12, further comprising:

in the display enable interval, outputting a drive signal according to a voltage of the second node;

generating a pulling down signal according to a first clock signal; and adjusting the drive signal's voltage level and the second node's voltage level according to a pulling down signal.

16. The driving method of claim 15, wherein the step of outputting the drive signal according to the voltage of the second node comprises providing a second clock signal to charge an output node according to the voltage of the second node, and a voltage level of the output node is at the voltage level of the drive signal.

17. The driving method of claim 16, wherein when the second clock signal is used to charge the output node, the drive signal is coupled to the second node to increase the voltage level of the second node.

18. The driving method of claim 15, further comprising resetting the voltage of the first node according to a reset signal.

19. The driving method of claim 18, wherein the reset signal comprises a drive signal of an adjacent shift register.

20. The driving method of claim 18, wherein the reset signal further comprises a start signal, the start signal being ahead of a drive signal output by a first-stage shift register.

* * * * *